United States Patent
Kapoor et al.

(10) Patent No.: US 9,366,725 B1
(45) Date of Patent: Jun. 14, 2016

(54) MULTIPLEXER CIRCUIT

(71) Applicants: Gourav Kapoor, Noida (IN); Preeti Agarwal, Agra (IN); Gaurav Gupta, Noida (IN)

(72) Inventors: Gourav Kapoor, Noida (IN); Preeti Agarwal, Agra (IN); Gaurav Gupta, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/642,768

(22) Filed: Mar. 10, 2015

(51) Int. Cl.
*H03K 17/00* (2006.01)
*G01R 31/3177* (2006.01)
*G01R 31/317* (2006.01)
*H03K 19/094* (2006.01)

(52) U.S. Cl.
CPC ...... *G01R 31/3177* (2013.01); *G01R 31/31724* (2013.01); *H03K 19/09429* (2013.01)

(58) Field of Classification Search
CPC .................................................... H03K 17/00
See application file for complete search history.

(56) References Cited

U.S. PATENT DOCUMENTS

| 6,819,141 B1 | 11/2004 | Qi et al. |
| 7,358,761 B1 | 4/2008 | Sunkavalli et al. |
| 7,652,516 B2 * | 1/2010 | Bourstein ................. G06F 1/08 327/291 |
| 8,587,344 B2 | 11/2013 | Masleid |

OTHER PUBLICATIONS

Dixit, Abhishek; Khandelwal, Saurabh; Akashe, Shyam; Design Low Power High Performance 8:1 MUX using Transmission Gate Logic (TGL), International Journal of Modern Engineering & Management Research, vol. 2, Issue 2, Jun. 2014.

* cited by examiner

*Primary Examiner* — Hai L Nguyen
(74) *Attorney, Agent, or Firm* — Charles E. Bergere

(57) ABSTRACT

A two-input multiplexer includes first, second, and third CMOS inverters, a transmission gate, and a tri-state inverter. The first CMOS inverter receives a select signal and outputs an inverted select signal. The second CMOS inverter receives a first input signal and outputs an inverted first input signal. The transmission gate receives the select signal, the inverted first input signal, and the inverted select signal, and outputs the inverted first input signal. The tri-state inverter receives the second input signal, the inverted select signal, and the select signal, and generates an inverted second input signal. The third CMOS inverter receives one of the inverted first and second input signals, and outputs one of the first and second input signals, respectively.

18 Claims, 5 Drawing Sheets

MULTIPLEXER CIRCUIT

BACKGROUND OF THE INVENTION

The present invention relates generally to integrated circuits, and more particularly, to a multiplexer circuit.

Integrated circuits (ICs) such as microprocessors, microcontroller units (MCUs), systems-on-chips (SoCs), and application specific integrated circuits (ASICs) include various circuits, such as hard and soft intellectual property (IP) cores, latches, registers, and combinational logic circuits. ICs often include self-test mechanisms such as logic built-in-self-test (LBIST) to enable self-checking of logic implemented on the IC. For example, LBIST procedures are often integrated in ISO 26262 standard compliant automotive electric and electronic devices where testing of safety features is crucial.

For an IC that includes LBIST, to enable testing of the circuits of the IC, the IC is configured to operate in functional and LBIST modes. When the IC is in functional mode, the circuits operate normally and enable the operation of the IC as per the desired application. When the IC is in LBIST mode, the circuits operate in a test mode to check for logic errors. For LBIST, typically the IC is divided into several LBIST partitions. Each LBIST partition includes a test controller that generates an enable signal to activate LBIST in that partition, a pseudo random pattern generator (PRPG), a flip-flop, a two-input multiplexer circuit, a circuit-under-test (CUT), and a multi-input shift register (MISR). The CUT includes one or more scan chains for shifting patterns of data through the CUT. During LBIST, the flip-flop loads the test patterns into the scan chains based on a clock signal. The responses to the test patterns are received from the scan chains and stored in the MISR in a compressed form (also referred to as a resultant signature). Subsequently, the resultant signature is compared with a stored golden signature that is indicative of correct responses to the test patterns. When the resultant and golden signatures match, the test controller determines that the CUT is functioning correctly.

Generally, the LBIST partitions exchange functional signals with each other when the IC is in functional mode. However, during selective LBIST of one or more selected LBIST partitions, the remaining LBIST partitions may not be tested and hence, may be set or operating in functional mode. Thus, when a set of LBIST partitions must be tested and another set of LBIST partitions are in functional mode, an LBIST partition belonging to the first set that is being tested may exchange functional signals with circuits of one or more of the LBIST partitions of the second set. For instance, if a functional signal (hereinafter referred to as "random signal") enters a LBIST partition while that partition is in LBIST mode, the random signal may lead to generation and storage of a false resultant signature in the MISR, thereby corrupting the LBIST execution. Such random signals are generally designated as x-signals and circuits such as flip-flops, latches, and memories propagate such x-signals to the LBIST partitions under test.

To ensure that x-signals do no enter an LBIST partition under test, x-signals are blocked or neutralized at the input of the LBIST partitions using x-bounding circuits. An x-bounding circuit includes a multiplexer circuit that is referred to as an x-bound multiplexer circuit. Each x-bound multiplexer circuit has first and second input terminals, a select terminal, and an output terminal. The first and second input terminals receive an x-signal and the test patterns, respectively. The select terminal receives the LBIST enable signal and the output terminal provides the x-signal or the test patterns based on the enable signal. When the LBIST partition is not being tested, the x-bound multiplexer circuit outputs the x-signal (the functional signal). When the LBIST partition is under test, the x-bound multiplexer circuit outputs the test patterns. Hence, the x-signal is blocked when the LBIST partition is under test, and is passed when the LBIST partition is not under test.

FIG. 1 is a schematic circuit diagram of a conventional two-input x-bound multiplexer circuit 100. The multiplexer circuit 100 includes first, second, and third CMOS inverters 102, 104, and 106, first and second transmission gates 108 and 110, and a fourth CMOS inverter 112 that are implemented using first through twelfth transistors 114-136.

The first CMOS inverter 102 is implemented using the first and second transistors 114 and 116. The first transistor 114 has a source terminal connected to a supply voltage $V_{dd}$ and a gate terminal connected to a select input (SL) pin for receiving a select signal (SL). The second transistor 116 has a source terminal connected to ground, a gate terminal connected to the select input (SL) pin for receiving the select signal (SL), and a drain terminal connected to a drain terminal of the first transistor 114 for generating an inverted select signal (/SL). For example, the gate terminals of the first and second transistors 114 and 116 may be connected to an LBIST controller (not shown) for receiving the select signal (SL).

The second CMOS inverter 104 is implemented using the third and fourth transistors 118 and 120. The third transistor 118 has a source terminal connected to the supply voltage $V_{dd}$ and a gate terminal connected to a first input (I1) pin for receiving a first input signal (I1). The fourth transistor 120 has a source terminal connected to ground, a gate terminal connected to the first input (I1) pin for receiving the first input signal (I1), and a drain terminal connected to a drain terminal of the third transistor 118 for generating an inverted first input signal. In an example, the gate terminals of the third and fourth transistors 118 and 120 are connected to a functional circuit (not shown) that includes the two-input multiplexer circuit 100 for receiving the x-signal as the first input signal (I1).

The third CMOS inverter 106 is implemented using the fifth and sixth transistors 122 and 124. The fifth transistor 122 has a source terminal connected to the supply voltage $V_{dd}$ and a gate terminal connected to a second input (I2) pin for receiving a second input signal (I2). The sixth transistor 124 has a source terminal connected to ground, a gate terminal connected to the second input (I2) pin for receiving the second input signal (I2), and a drain terminal connected to a drain terminal of the fifth transistor 122 for generating an inverted second input signal. In an example, the gate terminals of the fifth and sixth transistors 122 and 124 are connected to a flip-flop (not shown) for receiving the test patterns as the second input signal (I2).

The first transmission gate 108 is implemented using the seventh and eighth transistors 126 and 128. The seventh transistor 126 has a source terminal connected to the drain terminal of the third transistor 118 for receiving the inverted first input signal and a gate terminal connected to the select input (SL) pin for receiving the select signal (SL). The eighth transistor 128 has a source terminal connected to the drain terminal of the third transistor 118 for receiving the inverted first input signal, a gate terminal connected to the drain terminal of the first transistor 114 for receiving the inverted select signal, and a drain terminal connected to a drain terminal of the seventh transistor 126 for outputting the inverted first input signal.

The second transmission gate 110 is implemented using the ninth and tenth transistors 130 and 132. The ninth transistor 130 has a source terminal connected to the drain terminal of the fifth transistor 122 for receiving the inverted second input signal and a gate terminal connected to the drain terminal of the first transistor 114 for receiving the inverted select signal. The tenth transistor 132 has a source terminal connected to the drain terminal of the fifth transistor 122 for receiving the inverted second input signal, a gate terminal connected to the select input (SL) pin for receiving the select signal (SL), and a drain terminal connected to a drain terminal of the ninth transistor 130 for outputting the inverted second input signal.

The fourth CMOS inverter 112 is implemented using the eleventh and twelfth transistors 134 and 136. The eleventh transistor 134 has a source terminal connected to the supply voltage $V_{dd}$ and a gate terminal connected to the drain terminals of the seventh and ninth transistors 126 and 130 for receiving at least one of the inverted first and second input signals, respectively. The twelfth transistor 136 has a source terminal connected to ground, a gate terminal connected to the drain terminals of the seventh and ninth transistors 126 and 130 for receiving at least one of the inverted first and second input signals, respectively, and a drain terminal connected to a drain terminal of the eleventh transistor 134 for generating at least one of the first and second input signals (I1 and I2). The drain terminals of the eleventh and twelfth transistors 134 and 136 are connected to a circuit (not shown).

The first, third, fifth, seventh, ninth, and eleventh transistors 114, 118, 122, 126, 130, and 134 are p-channel metal-oxide semiconductor (PMOS) transistors, and the second, fourth, sixth, eighth, tenth, and twelfth transistors 116, 120, 124, 128, 132, and 136 are n-channel metal-oxide semiconductor (NMOS) transistors.

Based on a logic state of the select signal (SL), the multiplexer circuit 100 selects and outputs at least one of the first and second input signals (I1 and I2) at its output terminal. When the select signal (SL) is at a logic low state, the multiplexer circuit 100 selects and outputs the first input signal (I1) and when the select signal (SL) is high, the multiplexer circuit 100 selects and outputs the second input signal (I2).

However, with advancements in technology, the complexity of circuit designs of ICs has increased. To ensure correct evaluation of on-chip modules having such complex circuit designs, the SoC is divided into several LBIST partitions that include at least one x-bound multiplexer circuit. However, the addition of multiple x-bound multiplexer circuits leads to criticality in timing and power constraints. For instance, a complex SoC having 0.3 million flip-flops can have around 11 k x-bound multiplexer circuits. Thus, the overhead in terms of timing and power are high in such designs, thereby rendering the conventional x-bound multiplexer circuit inefficient for timing and power critical designs. For instance, the conventional x-bound multiplexer circuit cannot be used in SoCs that perform safety critical operations, such as opening of airbags in an automobile.

One known technique to overcome the aforementioned problem uses a high speed multiplexer circuit having high drive strength. The high speed multiplexer circuit is inserted at the input of the LBIST partition. The timing and power characteristics of the functional and test data-paths of the high speed multiplexer circuit that propagate the x-signals and the test patterns, respectively, are similar. However, the similarity of the two data-paths does not yield any benefit as the test data-path is generally static and does not have any timing requirement, whereas the functional data path is timing critical.

Therefore, it would be advantageous to have a two-input multiplexer circuit for blocking or neutralizing x-signals at the input of LBIST partitions of an SoC, reduces power consumption, and meets data path timing requirements.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
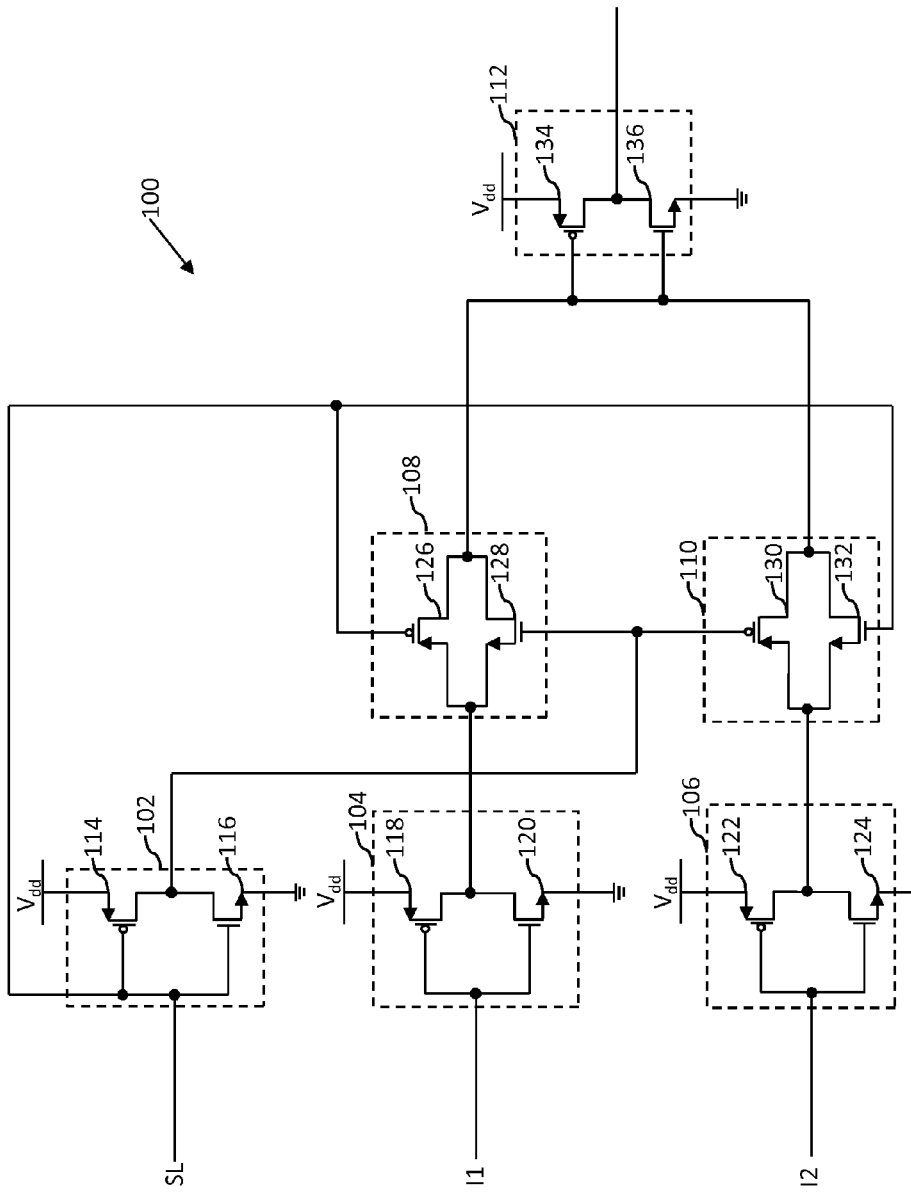
FIG. 1 is a schematic circuit diagram of a conventional two-input multiplexer circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the terms multiplexer and mux are used interchangeably.

In One embodiment of the present invention, a two-input multiplexer circuit is provided. The two-input multiplexer circuit includes first, second, and third CMOS inverters, a transmission gate, and a tri-state inverter. The first CMOS inverter receives a select signal and generates an inverted select signal. The second CMOS inverter receives a first input signal and generates an inverted first input signal. The transmission gate receives the select signal, the inverted first input signal, and the inverted select signal, and outputs the inverted first input signal. The tri-state inverter receives a second input signal, the inverted select signal, and the select signal, and outputs an inverted second input signal. The third CMOS inverter receives at least one of the inverted first and second input signals and generates at least one of the first and second input signals.

In another embodiment of the present invention, an integrated circuit that includes a functional circuit, a flip-flop, an LBIST controller, a two-input multiplexer circuit, and an on-chip logic module is provided. The functional circuit generates a functional signal. The flip-flop generates a scan signal. The LBIST controller generates a control signal. The two-input multiplexer circuit includes first, second, and third CMOS inverters, a transmission gate, and a tri-state inverter. The first CMOS inverter receives the control signal from the LBIST controller and generates an inverted control signal. The second CMOS inverter receives the functional signal from the functional circuit and generates an inverted functional signal. The transmission gate receives the control signal from the LBIST controller, the inverted functional signal from the second CMOS inverter, and the inverted control signal from the first CMOS inverter, and outputs the inverted functional signal. The tri-state inverter receives the scan signal from the flip-flop, the inverted control signal from the first CMOS inverter, and the control signal from the LBIST controller, and outputs an inverted scan signal. The third CMOS inverter receives at least one of the inverted functional and scan signals from the transmission gate and the tri-state inverter, respectively, and outputs at least one of the functional and scan signals. The on-chip logic module receives at least one of the functional and scan signals from the third CMOS inverter.

Various embodiments of the present invention provide a two-input multiplexer circuit. The two-input multiplexer circuit is utilized in an LBIST partition of an integrated circuit (IC), wherein the LBIST partition is operable in functional and LBIST modes. The two-input multiplexer circuit receives a first input signal from a functional circuit of the IC, a second input signal from a flip-flop of the IC, and a select signal from an LBIST controller. The first input signal includes functional signals when the LBIST partition is in the functional mode and x-signals when the LBIST partition is in the LBIST mode. The second input signal is a scan signal that includes test patterns when the LBIST partition is in the LBIST mode. The two-input multiplexer circuit includes first, second, and third CMOS inverters, a transmission gate, and a tri-state inverter. The first CMOS inverter receives the select signal and generates an inverted select signal. The second CMOS inverter receives the first input signal and generates an inverted first input signal. The transmission gate receives the select signal, the inverted first input signal, and the inverted select signal, and outputs the inverted first input signal. The tri-state inverter receives the second input signal, the inverted select signal, and the select signal, and outputs an inverted second input signal. The third CMOS inverter receives at least one of the inverted first and second input signals and outputs at least one of the first and second input signals.

The two-input multiplexer circuit has a first data path that includes the second CMOS inverter and the transmission gate and a second data path that includes the tri-state inverter. Therefore, the time required for the two-input multiplexer circuit to output the first input signal (the functional signal when the LBIST partition is in the functional mode) by way of the first data path is less as compared to the time required to output the second input signal (the test patterns when the LBIST partition is in the LBIST mode) by way of the second data path, thereby reducing timing overhead. Further, the tri-state inverter has low leakage power as compared to the transmission gate and the second CMOS inverter, thereby reducing power overhead.

Figure 2:
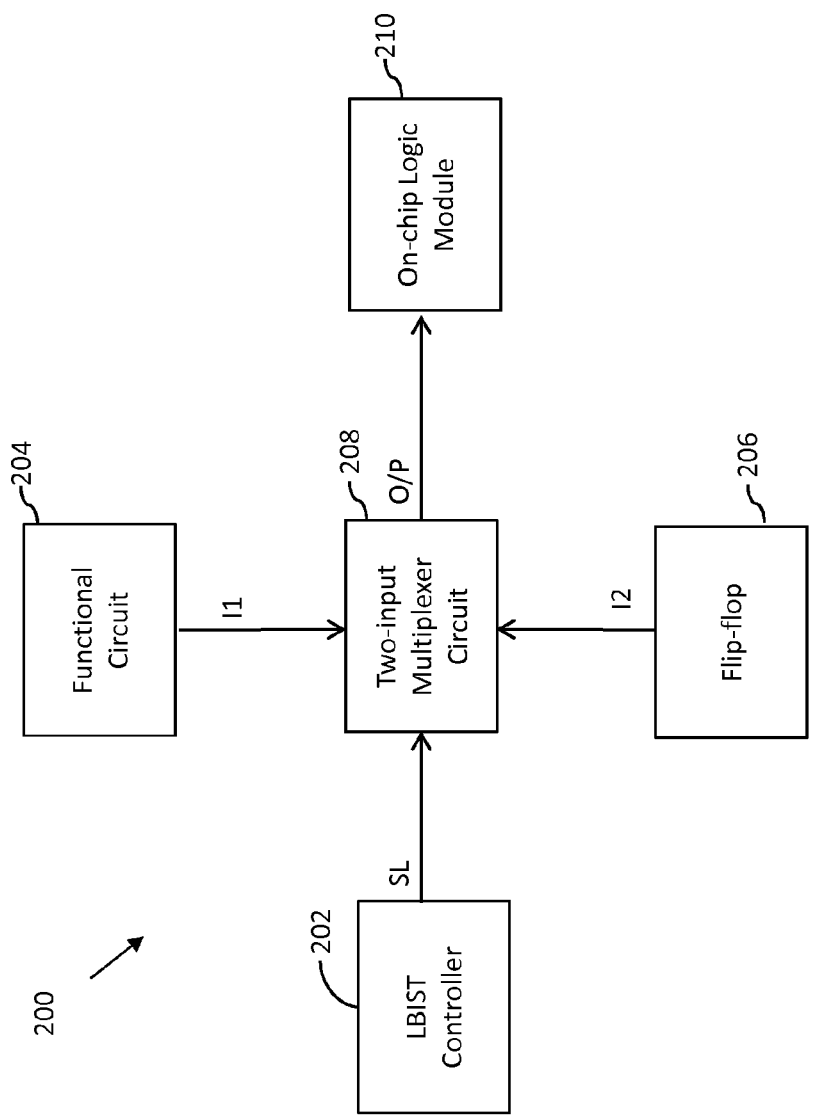
FIG. 2 is a schematic block diagram of an integrated circuit in accordance with an embodiment of the present invention.

Referring now to FIG. 2, a schematic block diagram of an integrated circuit (IC) 200 in accordance with an embodiment of the present invention is shown. The IC 200 includes a logic built-in self-test (LBIST) controller 202, a functional circuit 204, a flip-flop 206, a two-input multiplexer circuit 208, and an on-chip logic module 210. In an example, the two-input mux circuit 208 and the on-chip logic module 210 form an LBIST partition that operates in functional and LBIST modes. During the functional mode, the IC 200 operates in tandem with various electronic circuits (not shown) external to the IC 200 to enable a desired application such as opening of airbags and controlling displays. When the IC 200 is in the LBIST mode, various on-chip logic modules including the on-chip logic module 210 of the IC 200 that includes electronic circuits operate as circuits under test (CUTs) and undergo an LBIST to check for logic errors.

The LBIST controller 202 generates and provides a select signal (SL, also referred to as a "control signal") to the two-input mux circuit 208. When the IC 200 is in the functional mode, the LBIST controller 202 generates the select signal (SL) at a logic low state. When the IC 200 is in the LBIST mode, the LBIST controller 202 generates the select signal (SL) at a logic high state.

The functional circuit 204 generates and provides a first input signal (I1) to the two-input mux circuit 208. The functional circuit 204 may include flip-flops, latches, memories, etc. In an embodiment of the present invention, the functional circuit 204 may be internal or external to the IC 200. The first input signal (I1) may be a functional signal or an x-signal. The first input signal (I1) is the x-signal when the IC 200 is in the LBIST mode and the functional signal when the IC 200 is in the functional mode. In the functional mode, the functional signal includes data transmitted by way of the functional circuit 204 to the on-chip logic module 210 for normal operation of the IC 200.

The flip-flop 206 provides a second input signal (I2, also referred to as a "scan signal") to the two-input mux circuit 208. The flip-flop 206 stores test patterns that are generated by a pseudo random pattern generator (PRPG) when the IC 200 is in the LBIST mode. Thus, the flip-flop 206 outputs the test patterns as the second input signal (I2) for loading the test patterns in to the on-chip logic module 210 during the LBIST.

The two-input mux circuit 208 has a select terminal connected to the LBIST controller 202 for receiving the select signal (SL), a first input terminal connected to the functional circuit 204 for receiving the first input signal (I1), and a second input terminal connected to the flip-flop 206 for receiving the second input signal (I2). Based on a logic state of the select signal (SL), the two-input mux circuit 208 selects and outputs at least one of the first and second input signals (I1 and I2) at an output terminal thereof. When the select signal (SL) is low, the two-input mux circuit 208 selects and outputs the first input signal (I1), and hence outputs the functional signal when the IC 200 is in the functional mode. When the select signal (SL) is high, the two-input mux circuit 208 selects and outputs the second input signal (I2), and hence outputs the test patterns when the IC 200 is in the LBIST mode.

The on-chip logic module 210 is connected to the output terminal of the two-input mux circuit 208 for receiving at least one of the first and second input signals (I1 and I2). The on-chip logic module 210 operates as a CUT when the IC 200 is in the LBIST mode. In the LBIST mode, the on-chip logic module 210 receives the second input signal (I2), i.e., the test patterns. In the functional mode, the on-chip logic module 210 receives the first input signal (I1), i.e., the functional signal.

Figure 3:
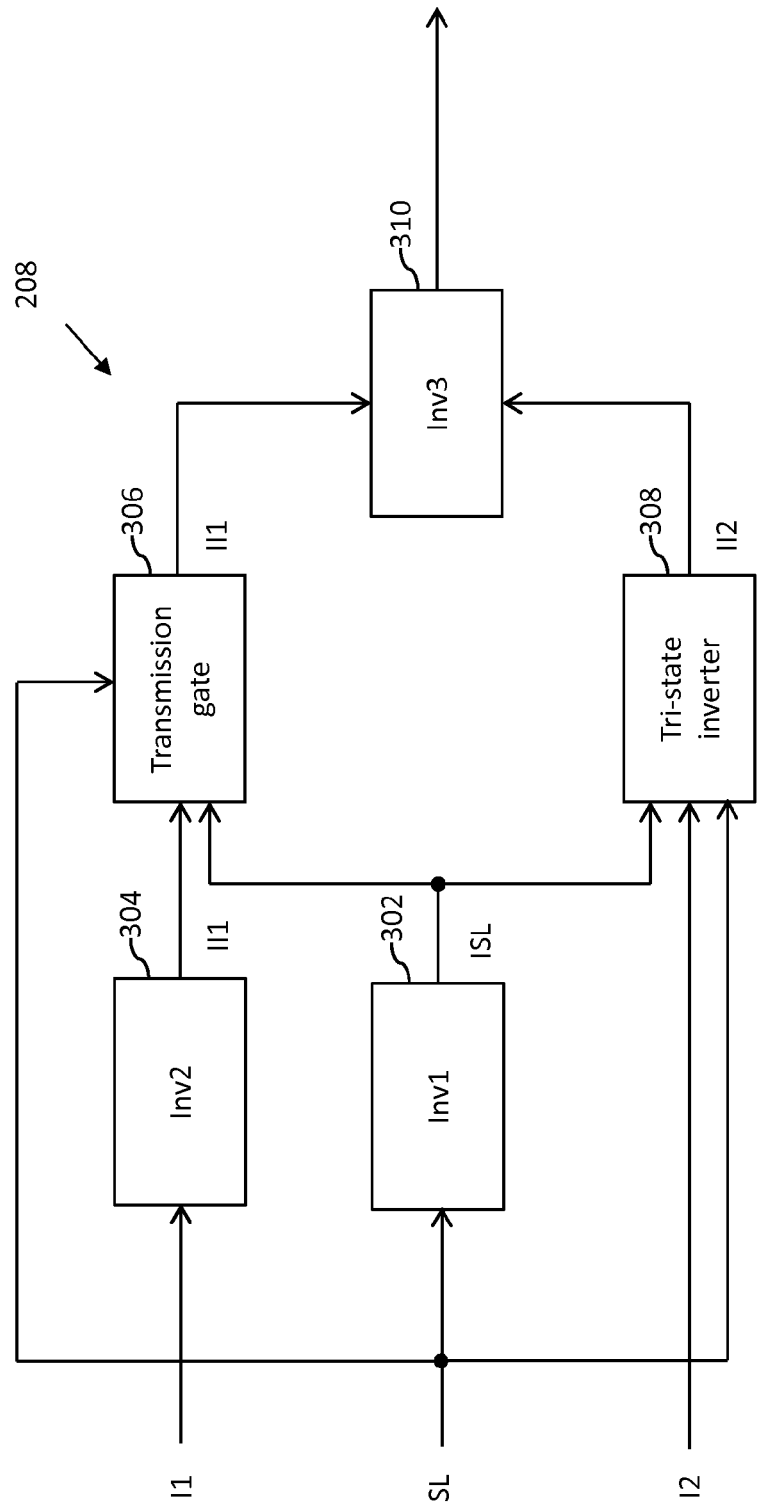
FIG. 3 is a schematic block diagram of a two-input multiplexer circuit of the integrated circuit of FIG. 2 in accordance with an embodiment of the present invention.

Referring now to FIG. 3, a schematic block diagram of the two-input mux circuit 208 of the IC 200 of FIG. 2 in accordance with an embodiment of the present invention is shown. The two-input mux circuit 208 includes first and second CMOS inverters 302 and 304, a transmission gate 306, a tri-state inverter 308, and a third CMOS inverter 310.

The first CMOS inverter 302 has an input terminal for receiving the select signal (SL) from the LBIST controller 202 and an output terminal for generating an inverted select signal (ISL, also referred to as an "inverted control signal").

The second CMOS inverter 304 has an input terminal for receiving the first input signal (I1) from the functional circuit 204 and an output terminal for generating an inverted first input signal (II1, also referred to as an "inverted functional signal").

The transmission gate 306 has a first input terminal for receiving the select signal (SL) from the LBIST controller 202, a second input terminal connected to the output terminal of the second CMOS inverter 304 for receiving the inverted first input signal (I1), a third input terminal connected to the output terminal of the first CMOS inverter 302 for receiving the inverted select signal (ISL), and an output terminal for outputting the inverted first input signal (II1).

The tri-state inverter 308 has a first input terminal for receiving the second input signal (I2) from the flip-flop 206, a second input terminal connected to the output terminal of the first CMOS inverter 302 for receiving the inverted select signal (ISL), a third input terminal for receiving the select signal (SL) from the LBIST controller 202, and an output terminal for generating an inverted second input signal (II2, also referred to as an "inverted scan signal").

The third CMOS inverter 310 has an input terminal connected to the output terminals of the transmission gate 306 and the tri-state inverter 308 for receiving at least one of the inverted first and second input signals (II1 and II2), respectively, and an output terminal connected to the on-chip logic module 210 for providing at least one of the first and second input signals (I1 and I2), respectively.

Figure 4:
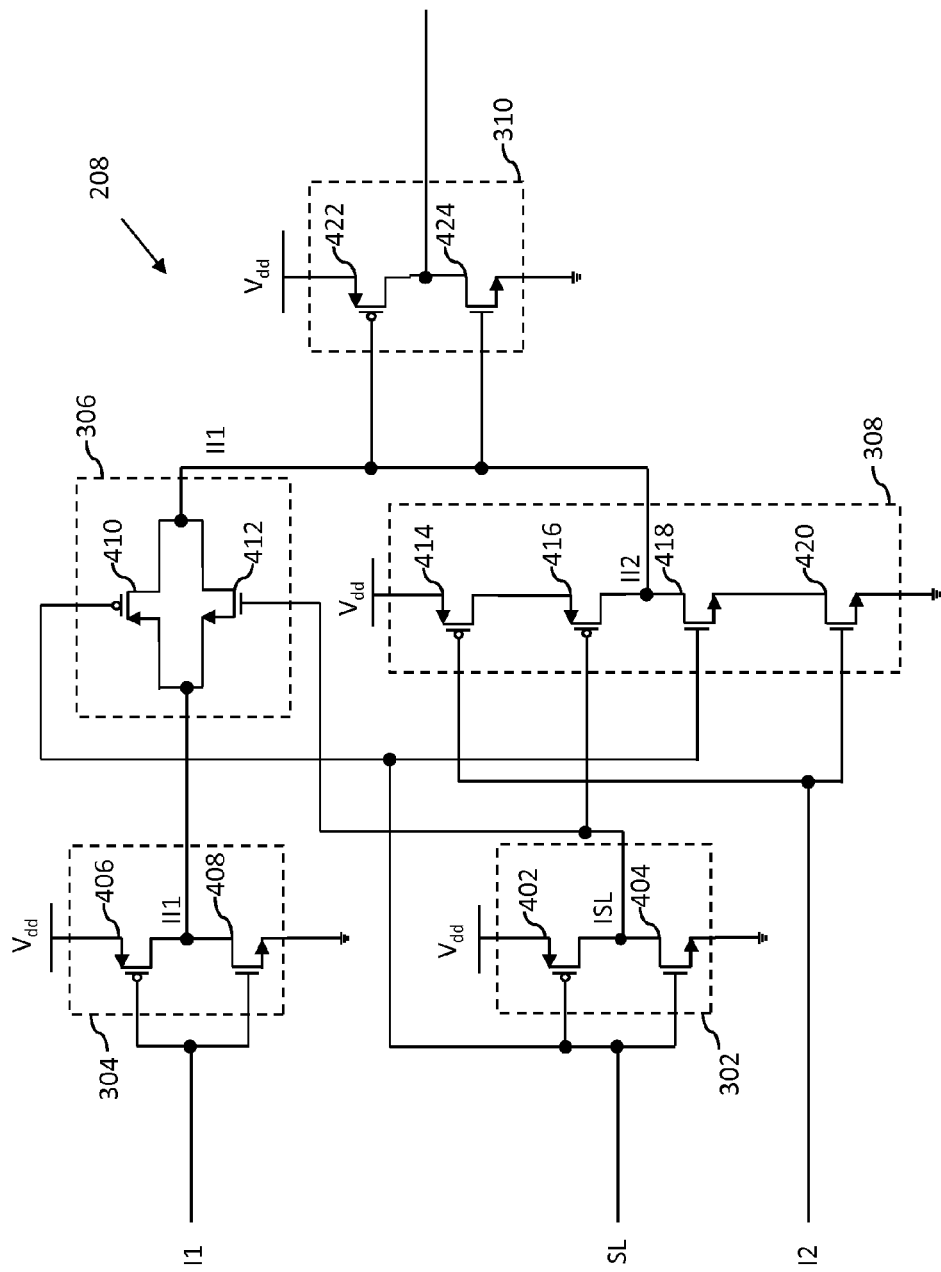
FIG. 4 is a schematic circuit diagram of the two-input multiplexer circuit of the integrated circuit of FIG. 2 in accordance with an embodiment of the present invention.

Referring now to FIG. 4, a schematic circuit diagram of the two-input mux circuit 208 of the IC 200 in accordance with an embodiment of the present invention is shown. The two-input mux circuit 208 includes first through twelfth transistors 402-424.

The first transistor 402 has a source terminal connected to a supply voltage $V_{dd}$ and a gate terminal connected to the LBIST controller 202 for receiving the select signal (SL). The second transistor 404 has a source terminal connected to ground, a gate terminal connected to the LBIST controller 202 for receiving the select signal (SL), and a drain terminal connected to a drain terminal of the first transistor 402 for generating the inverted select signal (ISL). The first and second transistors 402 and 404 form the first CMOS inverter 302 of the two-input mux circuit 208.

The third transistor 406 has a source terminal connected to the supply voltage $V_{dd}$ and a gate terminal connected to the functional circuit 204 for receiving the first input signal (I1). The fourth transistor 408 has a source terminal connected to ground, a gate terminal connected to the functional circuit 204 for receiving the first input signal (I1), and a drain terminal connected to a drain terminal of the third transistor 406 for generating the inverted first input signal (II1). The sixth and eighth transistors 406 and 408 form the second CMOS inverter 304 of the two-input mux circuit 208.

The fifth transistor 410 has a source terminal connected to the drain terminal of the third transistor 406 and a gate terminal connected to the LBIST controller 202 for receiving the select signal (SL). The sixth transistor 412 has a source terminal connected to the drain terminal of the third transistor 406, a gate terminal connected to the drain terminal of the first transistor 402, and a drain terminal connected to a drain terminal of the fifth transistor 410. The fifth and sixth transistors 410 and 412 form the transmission gate 306 of the two-input mux circuit 208.

The seventh transistor 414 has a source terminal connected to the supply voltage $V_{dd}$ and a gate terminal connected to the flip-flop 206 for receiving the second input signal (I2). The eighth transistor 416 has a source terminal connected to a drain terminal of the seventh transistor 414 and a gate terminal connected to the drain terminal of the first transistor 402. The ninth transistor 418 has a gate terminal connected to the LBIST controller 202 for receiving the select signal (SL) and a drain terminal connected to a drain terminal of the eighth transistor 416. The tenth transistor 420 has a source terminal connected to ground, a gate terminal connected to the flip-flop 206 for receiving the second input signal (I2), and a drain terminal connected to a source terminal of the ninth transistor 418. The seventh, eighth, ninth, and tenth transistors 414, 416, 418, and 420 form the tri-state inverter 308 of the two-input mux circuit 208.

The eleventh transistor 422 has a source terminal connected to the supply voltage $V_{dd}$ and a gate terminal connected to the drain terminals of the fifth and eighth transistors 410 and 416. The twelfth transistor 424 has a source terminal connected to ground, a gate terminal connected to the drain terminals of the fifth and eighth transistors 410 and 416, and a drain terminal connected to a drain terminal of the eleventh transistor 422. The drain terminals of the eleventh and twelfth transistors 422 and 424 are connected to the on-chip logic module 210. The eleventh and twelfth transistors 422 and 424 form the third CMOS inverter 310 of the two-input mux circuit 208.

In an embodiment of the present invention, the first, third, fifth, seventh, eighth, and eleventh transistors 402, 406, 410, 414, 416, and 422 are PMOS transistors, and the second, fourth, sixth, ninth, tenth, and twelfth transistors 404, 408, 412, 418, 420, and 424 are NMOS transistors.

In operation, when the IC 200 is in the functional mode, the LBIST controller 202 generates a low select signal (SL), the gate terminals of the first and second transistors 402 and 404 receive the logic low select signal (SL). Thus, the drain terminals of the first and second transistors 402 and 404 generate a high select signal (SL).

The gate terminals of the third and fourth transistors 406 and 408 receive the first input signal (I1) from the functional circuit 204. The first input signal (I1) is the functional signal during the functional mode. Thus, the drain terminals of the third and fourth transistors 406 and 408 generate the inverted first input signal (II1).

The gate terminal of the fifth transistor 410 receives the logic low select signal (SL) from the LBIST controller 202 and the source terminal of the fifth transistor 410 receives the inverted first input signal (II1) from the drain terminal of the third transistor 406. The gate terminal of the sixth transistor 412 receives the logic high select signal (SL) from the drain terminal of the first transistor 402 and the source terminal of the sixth transistor 412 receives the inverted first input signal (II1) from the drain terminal of the third transistor 406. Since, the fifth transistor 410 is the PMOS transistor, the logic low select signal (SL) at the gate terminal of the fifth transistor 410 switches ON the fifth transistor 410. Since, the sixth transistor 412 is the NMOS transistor, the high select signal (SL) at the gate of the sixth transistor 412 switches ON the sixth transistor 412. Hence, the drains of the fifth and sixth transistors 410 and 412 output the inverted first input signal (II1). Thus, the transmission gate 306 outputs the inverted first input signal (II1) at the output terminal when the select signal (SL) is low.

The gate terminal of the seventh transistor 414 receives the second input signal (I2), i.e., the test patterns from the flip-flop 206. The gate of the eighth transistor 416 receives the high select signal (SL) from the drain of the first transistor 402. The gate of the ninth transistor 418 receives the low select signal (SL) from the LBIST controller 202. The gate of the tenth transistor 420 receives the second input signal (I2) from the flip-flop 206. Since the eighth transistor 416 is a PMOS transistor, the high select signal (SL) at the gate of the eighth transistor 416 switches OFF the eighth transistor 416. Since the ninth transistor 418 is a NMOS transistor, the low select signal (SL) at the gate of the ninth transistor 418 switches OFF the ninth transistor 418. Hence, the drains of the eighth and ninth transistors 416 and 418 output a high impedance state (Z). Thus, for the low select signal (SL), the drains of the eighth and ninth transistors 416 and 418 do not generate the inverted second input signal (I/2).

The gates of the eleventh and twelfth transistors 422 and 424 receive the inverted first input signal (/I1) from the drain of the fifth transistor 410. Thus, the drains of the eleventh and twelfth transistors 422 and 424 output the first input signal (I1). Hence, for a low select signal (SL), the two-input mux circuit 208 outputs the first input signal (I1), i.e., the functional signal.

When the IC 200 is in LBIST mode, the LBIST controller 202 generates a high select signal (SL) and the gates of the first and second transistors 402 and 404 receive the high select signal (SL). Thus, the drains of the first and second transistors 402 and 404 generate a low select signal (SL).

The gates of the third and fourth transistors 406 and 408 receive the first input signal (I1) from the functional circuit 204. The first input signal (I1) is the x-signal during the LBIST mode. Thus, the drains of the third and fourth transistors 406 and 408 generate an inverted first input signal (/I1).

The gate terminal of the fifth transistor 410 receives the high select signal (SL) from the LBIST controller 202, and the source terminal of the fifth transistor 410 receives the inverted first input signal (/I1) from the drain of the third transistor 406. The gate terminal of the sixth transistor 412 receives the low select signal (SL) from the drain of the first transistor 402 and the source of the sixth transistor 412 receives the inverted first input signal (/I1) from the drain of the third transistor 406. Since the fifth transistor 410 is a PMOS transistor, the logic high select signal (SL) at the gate of the fifth transistor 410 switches OFF the fifth transistor 410. Since the sixth transistor 412 is a NMOS transistor, the low select signal (SL) at the gate of the sixth transistor 412 switches OFF the sixth transistor 412. Hence, the drains of the fifth and sixth transistors 410 and 412 output a floating value. Thus, for a logic high select signal (SL), the drains of the fifth and sixth transistor 410 and 412 block the inverted first input signal (/I1) and hence, block the x-signal or random signals.

The gate of the seventh transistor 414 receives the second input signal (I2), i.e., the test patterns from the flip-flop 206. The gate of the eighth transistor 416 receives the logic low select signal (SL) from the drain of the first transistor 402. The gate of the ninth transistor 418 receives the logic high select signal (SL) from the LBIST controller 202. The gate of the tenth transistor 420 receives the second input signal (I2) from the flip-flop 206. Since the eighth transistor 416 is a PMOS transistor, the logic low select signal (SL) at the gate of the eighth transistor 416 switches ON the eighth transistor 416. Since the ninth transistor 418 is a NMOS transistor, the logic high select signal (SL) at the gate of the ninth transistor 418 switches ON the ninth transistor 418. Hence, the drains of the eighth and ninth transistors 416 and 418 generate the inverted second input signal (/I2). Thus, the tri-state inverter 308 generates the inverted second input signal (/I2) at the output terminal when the select signal (SL) is high.

The gates of the eleventh and twelfth transistors 422 and 424 receive the inverted second input signal (/I2) from the drain of the eighth transistor 416. Thus, the drains of the eleventh and twelfth transistors 422 and 424 generate the second input signal (I2). Hence, for the logic high select signal (SL), the two-input mux circuit 208 outputs the second input signal (I2), i.e., the test patterns.

Thus, the two-input mux circuit 208 has a first data path for propagating the first input signal (I1), i.e., the functional signal to the on-chip logic module 210 and a second data path for propagating the second input signal (I2), i.e., the test patterns to the on-chip logic module 210.

In an embodiment of the present invention, the tri-state inverter 308 operates at a very low frequency as compared to the second CMOS inverter 304 and the transmission gate 306. Thus, the operational time for transmission of signals required by the second CMOS inverter 304 and the transmission gate 306 is less as compared to the tri-state inverter 308. Thus, the first data path propagates the functional signal faster as compared to the second data path that propagates the scan signal. Hence, when the IC 200 is in the functional mode, the first data path is selected for providing the functional signal, thereby reducing the delay in the functioning of the IC 200. Therefore, the timing overhead of the IC 200 caused due to the two-input mux circuit 208 is reduced.

Further, the tri-state inverter 308 induces low leakage power as compared to the second CMOS inverter 304 and the transmission gate 306. Thus, the second data path that propagates the test patterns ensures low leakage power as compared to the leakage power in the first data path. Thus, when the IC 200 is in the LBIST mode, the second data path is selected for providing the scan signal, thereby reducing the leakage power dissipated during the LBIST. Thus, the power overhead of the IC 200 caused due to the two-input mux circuit 208 is reduced.

It will be apparent to a person skilled in the art that the two-input mux circuit 208 can be implemented in any SoC that requires timing and power criticality. Further, it will be apparent to a person skilled in the art that in another embodiment of the present invention, the second data path includes the second CMOS inverter 304 and the transmission gate 306 and the first data path includes the tri-state inverter 308.

Figure 5:
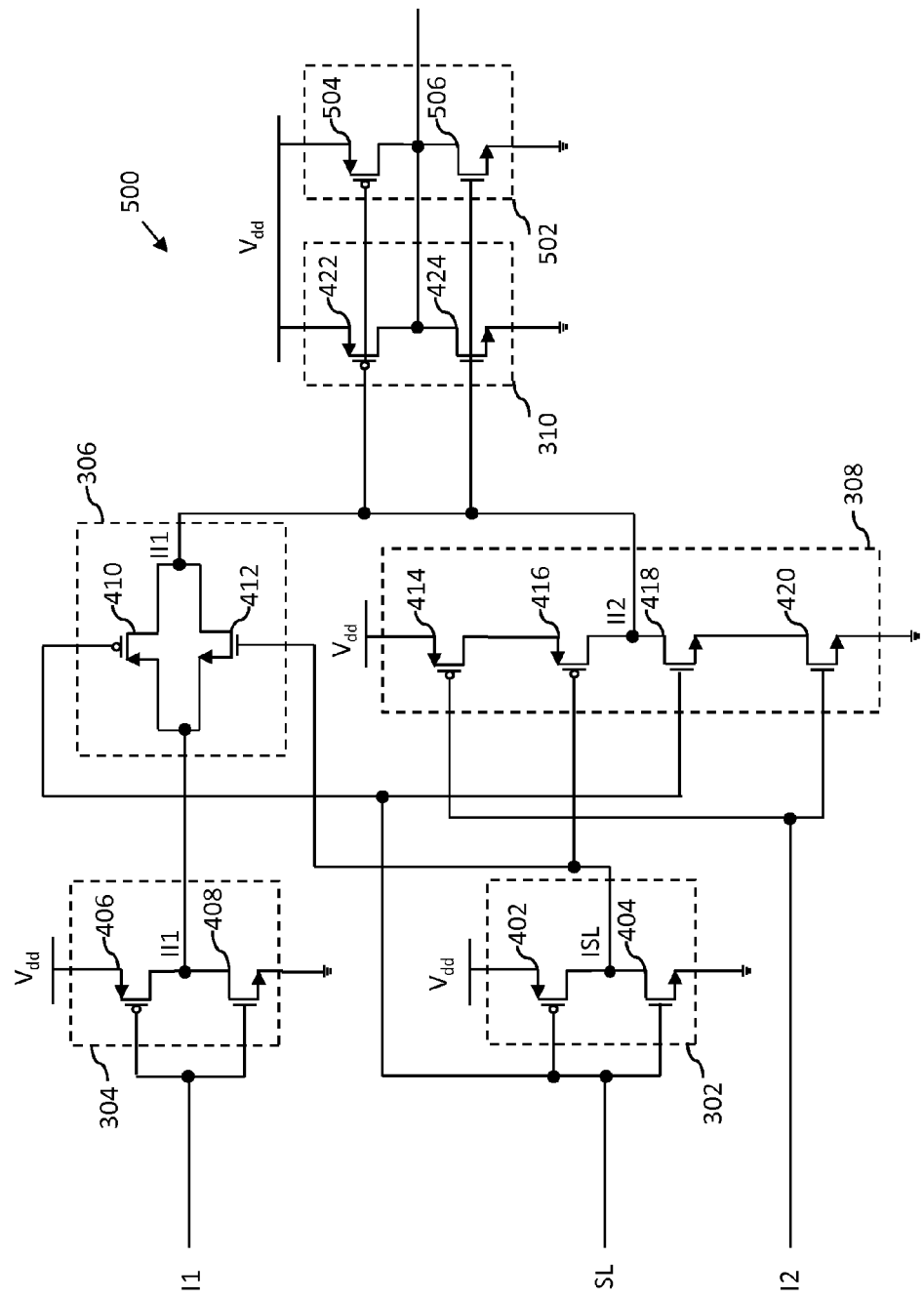
FIG. 5 is a schematic circuit diagram of a two-input multiplexer circuit of the integrated circuit of FIG. 2 in accordance with another embodiment of the present invention.

Referring now to FIG. 5, a schematic circuit diagram of a two-input mux circuit 500 of the IC 200 of FIG. 2 in accordance with another embodiment of the present invention is shown. The two-input mux circuit 500 includes the first through twelfth transistors 402-424 and a fourth CMOS inverter 502. The operation of the first through twelfth transistors 402-424 is as explained in conjunction with FIG. 4.

The fourth CMOS inverter 502 includes thirteenth and fourteenth transistors 504 and 506. The thirteenth transistor 504 has a source terminal connected to the supply voltage $V_{dd}$ and a gate terminal connected to the drain terminals of the fifth and eighth transistors 410 and 416 for receiving at least one of the inverted first and second input signals (/I1 and /I2), respectively. The fourteenth transistor 506 has a source terminal connected to ground, a gate terminal connected to the drain terminals of the fifth and eighth transistors 410 and 416 for receiving at least one of the inverted first and second input signals (/I1 and /I2), respectively, and a drain terminal connected to a drain terminal of the thirteenth transistor 504 for generating at least one of the first and second input signals (I1 and I2), respectively.

Thus, the two-input mux circuit 500 includes two additional transistors as compared to the two-input mux circuit 208 of FIG. 4, and hence has two CMOS inverters at its output stage. As will be apparent to a person skilled in the art, a single CMOS inverter has a capacity to drive several gates. By adding another CMOS inverter, i.e., the fourth CMOS inverter 502, at the output stage, the driving strength of the third and fourth CMOS inverters 310 and 502 at the output stage doubles, thereby enabling the two-input mux circuit 500 to drive additional components that are connected at the output stage of the fourth CMOS inverter 502.

In another embodiment of the present invention, the thirteenth transistor 504 is a PMOS transistor, and the fourteenth transistor 506 is an NMOS transistor.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A two-input multiplexer circuit, comprising:
   a first CMOS inverter having an input terminal for receiving a select signal and an output terminal for generating an inverted select signal;
   a second CMOS inverter having an input terminal for receiving a first input signal and an output terminal for generating an inverted first input signal;
   a transmission gate having a first input terminal for receiving the select signal, a second input terminal connected to the output terminal of the second CMOS inverter for receiving the inverted first input signal, a third input terminal connected to the output terminal of the first CMOS inverter for receiving the inverted select signal, and an output terminal for outputting the inverted first input signal;
   a tri-state inverter having a first input terminal for receiving a second input signal, a second input terminal connected to the output terminal of the first CMOS inverter for receiving the inverted select signal, a third input terminal for receiving the select signal, and an output terminal for generating an inverted second input signal; and
   a third CMOS inverter, having an input terminal connected to the output terminals of the transmission gate and the tri-state inverter for receiving at least one of the inverted first and second input signals, respectively, and an output terminal for outputting at least one of the first and second input signals.

2. The two-input multiplexer circuit of claim 1, wherein the first CMOS inverter comprises:
   a first transistor having a source terminal for receiving a supply voltage and a gate terminal for receiving the select signal; and
   a second transistor having a gate terminal for receiving the select signal, a source terminal connected to ground, and a drain terminal connected to a drain terminal of the first transistor for generating the inverted select signal.

3. The two-input multiplexer circuit of claim 2, wherein the second CMOS inverter comprises:
   a third transistor having a source terminal for receiving the supply voltage and a gate terminal for receiving the first input signal; and
   a fourth transistor having a gate terminal for receiving the first input signal, a source terminal connected to ground, and a drain terminal connected to a drain terminal of the third transistor for generating the inverted first input signal.

4. The two-input multiplexer circuit of claim 3, wherein the transmission gate comprises:
   a fifth transistor having a source terminal connected to the drain terminal of the third transistor for receiving the inverted first input signal and a gate terminal for receiving the select signal; and
   a sixth transistor having a gate terminal connected to the drain terminal of the first transistor for receiving the inverted select signal, a source terminal connected to the drain terminal of the third transistor for receiving the inverted first input signal, and a drain terminal connected to a drain terminal of the fifth transistor for outputting the inverted first input signal.

5. The two-input multiplexer circuit of claim 4, wherein the tri-state inverter comprises:

a seventh transistor having a source terminal for receiving the supply voltage and a gate terminal for receiving the second input signal;
   an eighth transistor having a source terminal connected to a drain terminal of the seventh transistor and a gate terminal connected to the drain terminal of the first transistor for receiving the inverted select signal;
   a ninth transistor having a gate terminal for receiving the select signal and a drain terminal connected to a drain terminal of the eighth transistor for generating the inverted second input signal; and
   a tenth transistor having a drain terminal connected to a source terminal of the ninth transistor, a source terminal connected to ground, and a gate terminal for receiving the second input signal.

6. The two-input multiplexer circuit of claim 5, wherein the third CMOS inverter comprises:
   an eleventh transistor having a source terminal for receiving the supply voltage and a gate terminal connected to the drain terminals of the fifth and eighth transistors for receiving at least one of the inverted first and second input signals, respectively; and
   a twelfth transistor having a gate terminal connected to the drain terminals of the fifth and eighth transistors for receiving at least one of the inverted first and second input signals, respectively, a source terminal connected to ground, and a drain terminal connected to a drain terminal of the eleventh transistor for outputting at least one of the first and second input signals.

7. The two-input multiplexer circuit of claim 6, wherein the first, third, fifth, seventh, eighth, and eleventh are p-channel, metal-oxide semiconductor (PMOS) transistors.

8. The two-input multiplexer circuit of claim 7, wherein the second, fourth, sixth, ninth, tenth, and twelfth are n-channel, metal-oxide semiconductor (NMOS) transistors.

9. The two-input multiplexer circuit of claim 6, wherein the two-input multiplexer circuit is integrated into a testable integrated circuit (IC).

10. The two-input multiplexer circuit of claim 9, wherein the input terminal of the first CMOS inverter receives the select signal from a logic, built-in, self-test (LBIST) controller of the testable IC, the input terminal of the second CMOS inverter receives the first input signal from a functional circuit of the testable IC, the first input terminal of the tri-state inverter receives the second input signal from a flip-flop of the testable IC, and the output terminal of the third CMOS inverter is connected to an on-chip module of the testable IC.

11. An integrated circuit, comprising:
    a functional circuit for generating a functional signal;
    a flip-flop for generating a scan signal;
    a logic built-in self-test (LBIST) controller for generating a control signal;
    a two-input multiplexer circuit, comprising:
       a first CMOS inverter having an input terminal connected to the LBIST controller for receiving the control signal and an output terminal for generating an inverted control signal;
       a second CMOS inverter having an input terminal connected to the functional circuit for receiving the functional signal and an output terminal for generating an inverted functional signal;
       a transmission gate having a first input terminal connected to the LBIST controller for receiving the control signal, a second input terminal connected to the output terminal of the second CMOS inverter for receiving the inverted functional signal, a third input terminal connected to the output terminal of the first CMOS inverter for receiving the inverted control signal, and an output terminal for outputting the inverted functional signal;

a tri-state inverter having a first input terminal connected to the flip-flop for receiving the scan signal, a second input terminal connected to the output terminal of the first CMOS inverter for receiving the inverted control signal, a third input terminal connected to the LBIST controller for receiving the control signal, and an output terminal for generating an inverted scan signal; and a third CMOS inverter, having an input terminal connected to the output terminals of the transmission gate and the tri-state inverter for receiving at least one of the inverted functional and scan signals, respectively, and an output terminal for outputting at least one of the functional and scan signals; and an on-chip logic module, connected to the output terminal of the third CMOS inverter, for receiving at least one of the functional and scan signals, respectively.

12. The integrated circuit of claim 11, wherein the first CMOS inverter comprises:

a first transistor having a source terminal for receiving a supply voltage and a gate terminal connected to the LBIST controller for receiving the control signal; and a second transistor having a gate terminal connected to the LBIST controller for receiving the control signal, a source terminal connected to ground, and a drain terminal connected to a drain terminal of the first transistor for generating the inverted control signal.

13. The integrated circuit of claim 12, wherein the second CMOS inverter comprises:

a third transistor having a source terminal for receiving the supply voltage and a gate terminal connected to the functional circuit for receiving the functional signal; and a fourth transistor having a gate terminal connected to the functional circuit for receiving the functional signal, a source terminal connected to ground, and a drain terminal connected to a drain terminal of the third transistor for generating the inverted functional signal.

14. The integrated circuit of claim 13, wherein the transmission gate comprises:

a fifth transistor having a source terminal connected to the drain terminal of the third transistor for receiving the inverted functional signal and a gate terminal connected to the LBIST controller for receiving the control signal; and a sixth transistor having a gate terminal connected to the drain terminal of the first transistor for receiving the inverted control signal, a source terminal connected to the drain terminal of the third transistor for receiving the inverted functional signal, and a drain terminal connected to a drain terminal of the fifth transistor for outputting the inverted functional signal.

15. The integrated circuit of claim 14, wherein the tri-state inverter comprises:

a seventh transistor having a source terminal for receiving the supply voltage and a gate terminal connected to the flip-flop for receiving the scan signal;

an eighth transistor having a source terminal connected to a drain terminal of the seventh transistor and a gate terminal connected to the drain terminal of the first transistor for receiving the inverted control signal;

a ninth transistor having a gate terminal connected to the LBIST controller for receiving the control signal and a drain terminal connected to a drain terminal of the eighth transistor for generating the inverted scan signal; and a tenth transistor having a drain terminal connected to a source terminal of the ninth transistor, a source terminal connected to ground, and a gate terminal connected to the flip-flop for receiving the scan signal.

16. The integrated circuit of claim 15, wherein the third CMOS inverter comprises:

an eleventh transistor having a source terminal for receiving the supply voltage and a gate terminal connected to the drain terminals of the fifth and eighth transistors for receiving at least one of the inverted functional and scan signals, respectively; and a twelfth transistor having a gate terminal connected to the drain terminals of the fifth and eighth transistors for receiving at least one of the functional and scan signals, respectively, a source terminal connected to ground, and a drain terminal connected to a drain terminal of the eleventh transistor for outputting at least one of the functional and scan signals.

17. The integrated circuit of claim 16, wherein the first, third, fifth, seventh, eighth, and eleventh are p-channel, metal-oxide semiconductor (PMOS) transistors.

18. The integrated circuit of claim 17, wherein the second, fourth, sixth, ninth, tenth, and twelfth are n-channel, metal-oxide semiconductor (NMOS) transistors.

* * * * *